US012796434B2

(12) United States Patent
Park et al.

(10) Patent No.: US 12,796,434 B2
(45) Date of Patent: Nov. 10, 2026

(54) SKIP VIA WITH LOCALIZED SPACER

(71) Applicant: INTERNATIONAL BUSINESS MACHINES CORPORATION, Armonk, NY (US)

(72) Inventors: Chanro Park, Clifton Park, NY (US); Koichi Motoyama, Clifton Park, NY (US); Yann Mignot, Slingerlands, NY (US); Hsueh-Chung Chen, Cohoes, NY (US)

(73) Assignee: International Business Machines Corporation, Armonk, NY (US)

( * ) Notice: Subject to any disclaimer, the term of this patent is extended or adjusted under 35 U.S.C. 154(b) by 628 days.

(21) Appl. No.: 17/897,876

(22) Filed: Aug. 29, 2022

(65) Prior Publication Data

US 2024/0071904 A1 Feb. 29, 2024

(51) Int. Cl.

| | |
|---|---|
| ***H10W 20/42*** | (2026.01) |
| ***H10P 50/28*** | (2026.01) |
| ***H10W 20/00*** | (2026.01) |
| ***H10W 20/41*** | (2026.01) |
| ***H10W 20/48*** | (2026.01) |

(52) U.S. Cl.

CPC ........... *H10W 20/42* (2026.01); *H10P 50/285* (2026.01); *H10W 20/035* (2026.01); *H10W 20/042* (2026.01); *H10W 20/076* (2026.01); *H10W 20/084* (2026.01); *H10W 20/425* (2026.01); *H10W 20/435* (2026.01); *H10W 20/48* (2026.01)

(58) Field of Classification Search

None

See application file for complete search history.

(56) References Cited

U.S. PATENT DOCUMENTS

| | | | |
|---|---|---|---|
| 9,805,972 B1 | 10/2017 | Zhang et al. | |
| 9,911,651 B1 | 3/2018 | Briggs et al. | |
| 10,319,629 B1 * | 6/2019 | Yang | H01L 21/76834 |
| 10,622,301 B2 | 4/2020 | Xu et al. | |
| 10,636,698 B2 | 4/2020 | Zhang et al. | |
| 11,152,298 B2 | 10/2021 | Mignot et al. | |
| 11,201,112 B2 | 12/2021 | Cheng et al. | |
| 2016/0358859 A1 * | 12/2016 | Murray | H01L 23/53233 |
| 2019/0021176 A1 | 1/2019 | Law et al. | |
| 2019/0027401 A1 | 1/2019 | McMahon et al. | |
| 2019/0332738 A1 | 10/2019 | Shao et al. | |
| 2020/0111736 A1 | 4/2020 | Amanapu et al. | |
| 2020/0388567 A1 * | 12/2020 | Mignot | H01L 21/76877 |
| 2021/0375636 A1 | 12/2021 | Parikh | |

* cited by examiner

*Primary Examiner* — Sue A Purvis
*Assistant Examiner* — Carnell Hunter, III
(74) *Attorney, Agent, or Firm* — Harrity & Harrity, LLP

(57) ABSTRACT

A microelectronics structure including a skip level via extending from an upper level metal line in an upper level of the at least two interlevel dielectric levels through a first an interlevel dielectric level that is on the substrate level without contacting an interlevel metal line. The skip level via extends into electrical contact with a first element of electrical contact features in a lower level of the at least two interlevel dielectric levels. The skip level via includes a spacer that is present on sidewalls of the skip level via. The structure also includes a single level via, in which the dielectric material of the spacer of the skip level via is not present on the sidewalls of the single level via.

20 Claims, 13 Drawing Sheets

SKIP VIA WITH LOCALIZED SPACER

BACKGROUND

The present disclosure relates to interconnects for transmitting electrical signal, and more particularly to metal vias.

Interconnects are the wiring schemes in integrated circuits, which may be formed during back-end-of-line (BEOL) processing. Interconnects can distribute clock and other signals, provide power and ground for various electronic system components, and interconnect the transistors within the integrated circuit (IC) chip front-end-of-line (FEOL). Interconnects are organized in different metal layers, local ($M_x$), intermediate, semi-global and global wires. The total number of layers can be as many as 15, while the typical number of $M_x$ layers ranges between 3 and 6. Each of these layers contains (unidirectional) metal lines (or tracks) and dielectric materials. They are interconnected vertically by means of via structures that are filled with metal. With increased scaling, the degree of separation between adjacent structures is reducing, which in turn increases the possibility for shorting of interconnects with other electrically conductive structures.

SUMMARY

In one aspect, an electrical communication structure is provided that includes vias, e.g., skip vias or super vias, which have an inner spacer on the sidewalls of the via opening. The electrical communication also includes a single level via within the same substrate structure that does not include the vertical spacer.

In one embodiment, the electrical communication structure includes a skip level via extending from an upper level metal line in an upper level of the at least two interlevel dielectric levels through a first an interlevel dielectric level that is on the substrate level without contacting an interlevel metal line. In some embodiments, the skip level via extends into electrical contact with a first element of electrical contact features in a lower level of the at least two interlevel dielectric levels, wherein the skip level via includes a spacer that is present on sidewalls of the skip level via. The electrical communications structure can further include a single level via extending from the interlevel metal line into electrical contact with at least a second element of the electrical contact features. The dielectric material of the spacer for the skip level via is not present on the sidewalls of the single level via. In some examples, the above described structure may be formed using a single damascene method. In some examples, the spacer extends along an entire height of the skip level via sidewall.

In another embodiment, an electrical communication structure is provided that includes a skip level via having a spacer on only a portion of the sidewalls of the skip level via opening. In this embodiment, the electrical communication structure may be formed using a dual damascene method. In some examples, the electrical communication structure includes a skip level via extending from an upper level metal line in an upper level of the at least two interlevel dielectric levels through a first an interlevel dielectric level that is on the substrate level without contacting an interlevel metal line. In some embodiments, the skip level via extends into electrical contact with a first element of electrical contact features in a lower level of the at least two interlevel dielectric levels.

The skip level via includes a spacer that is present on a lower portion of sidewalls of the skip level via opening. The electrical communications structure can further include a single level via extending from the interlevel metal line into electrical contact with at least a second element of the electrical contact features. The dielectric material of the spacer for the skip level via is not present on the sidewalls of the single level via.

In another embodiment, a microelectronic structure is provided including the skip via. The microelectronic structure may include a first metal layer and at least two metal lines located above the first metal layer. In some embodiments, a first conductive via is present connecting each of the at least two second metal lines to the first metal layer. A third metal layer can be located above the second metal layer. A second conductive via connects the third metal layer to the first metal layer. The second conductive via may be referred to as a skip via. In some embodiments, a liner is located on the walls of the second conducive via. The liner is located between the second conductive via and the second metal line.

In yet another aspect of the present disclosure, a method of forming an electrical communication structure is provided. In one embodiment, the method includes forming a skip via opening through a plurality of interlevel dielectric layers including an interlevel metal line to a first interlevel dielectric layer in a first region of the electrical communication structure. The skip open via exposes an upper surface of a first metal line in an underlying lower interlevel dielectric layer. An inner spacer is formed on the sidewalls of the skip via opening, wherein the inner spacer obstructs shorting to the interlevel metal line. A block mask is formed protecting the first region, and a single level via opening is formed in the second region of the electrical communication structure. The skip via opening and the single level via openings are filled with electrically conductive material to form a skip level via and a single level via. Thereafter, an upper level interlevel dielectric layer is formed having a third metal line in electrical communication with the skip level via and the single level via.

DETAILED DESCRIPTION OF PREFERRED EMBODIMENTS

Figure 1:
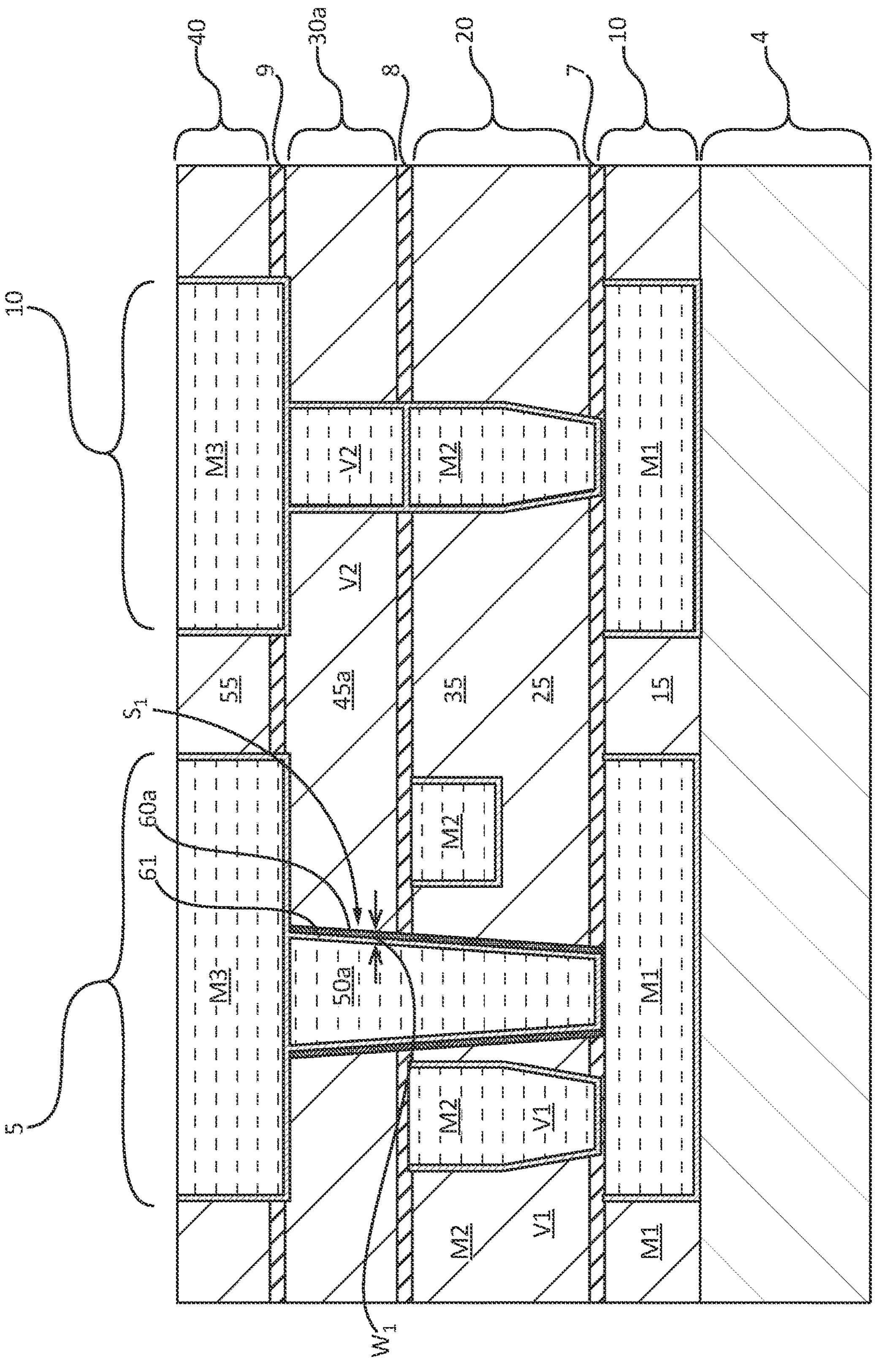
FIG. 1 is a side cross-sectional view of a first embodiment of an electronic structure including a skip via, in which the skip via includes an inner spacer that extends along an entire height of the via opening and the skip via is formed using a single damascene process, in accordance with one embodiment of the present disclosure.

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present description. For purposes of the description hereinafter, the terms "upper", "lower", "right", "left", "vertical", "horizontal", "top", "bottom", and derivatives thereof shall relate to the embodiments of the disclosure, as it is oriented in the drawing figures. The terms "present on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

Node scaling has required the dimensional reduction of the back-end-of-line (BEOL) structures, leading to reduced interconnect metal pitches. However, the downscaling of device dimensions with increasing smaller technology node is becoming increasingly challenging. One method/structure to enable increased scaling is the "super via", which is also referred to as "skip via". The term "super via" or "skid via" denotes a via that provides direct connection from a first metal layer ($M_x$) to an upper metal layer, e.g., $M_{x+2}$ metal layer, by bypassing an intermediate metal layer, e.g., $M_{x+1}$ layer. A via that is connects two metal layers on different levels, while skipping connectivity to an intermediate metal layer that is positioned therebetween, can be referred to as a "skip" via. Hereafter the term "skip via" will be employed, and refers to both skip vias and super vias.

Skip via cells reduce cell size and make routing easier with reduced contact resistance. However, the deep via depths that are characteristic of a skip via tend to result in a larger critical dimension (CD) due to longer etching time. Further, the potential exists for via to line shorting, as the skip via can extend through multiple layers of interlevel dielectrics including metal lines present therein. Additionally, the skip via can also suffer from the effects of time dependent dielectric breakdown (TDDB).

The methods and structures described herein can reduce the risk of skip vias shorting to metal lines, and can improve time dependent dielectric breakdown (TDDB). The methods and structures of the present disclosure can address the aforementioned disadvantages in skip vias by introducing an inner spacer only to the skip-via structures. It has been determined that introducing the aforementioned inner spacer to the vias that are not skip vias results in a performance degradation at the vias that are not skip vias. The performance degradation in the normal single level vias results from an increase in contact resistance that occurs to the reduced cross section for the contact of the via to the metal line with the inner spacer present. The methods and structures of the present disclosure avoid this disadvantage by only integrating the inner spacer with the skip vias.

The method and structures for fabricating skip vias with localized inner spacers for reducing skip via shorting to metal lines are now described in more detail with reference to FIGS. 1-13.

Figure 2:
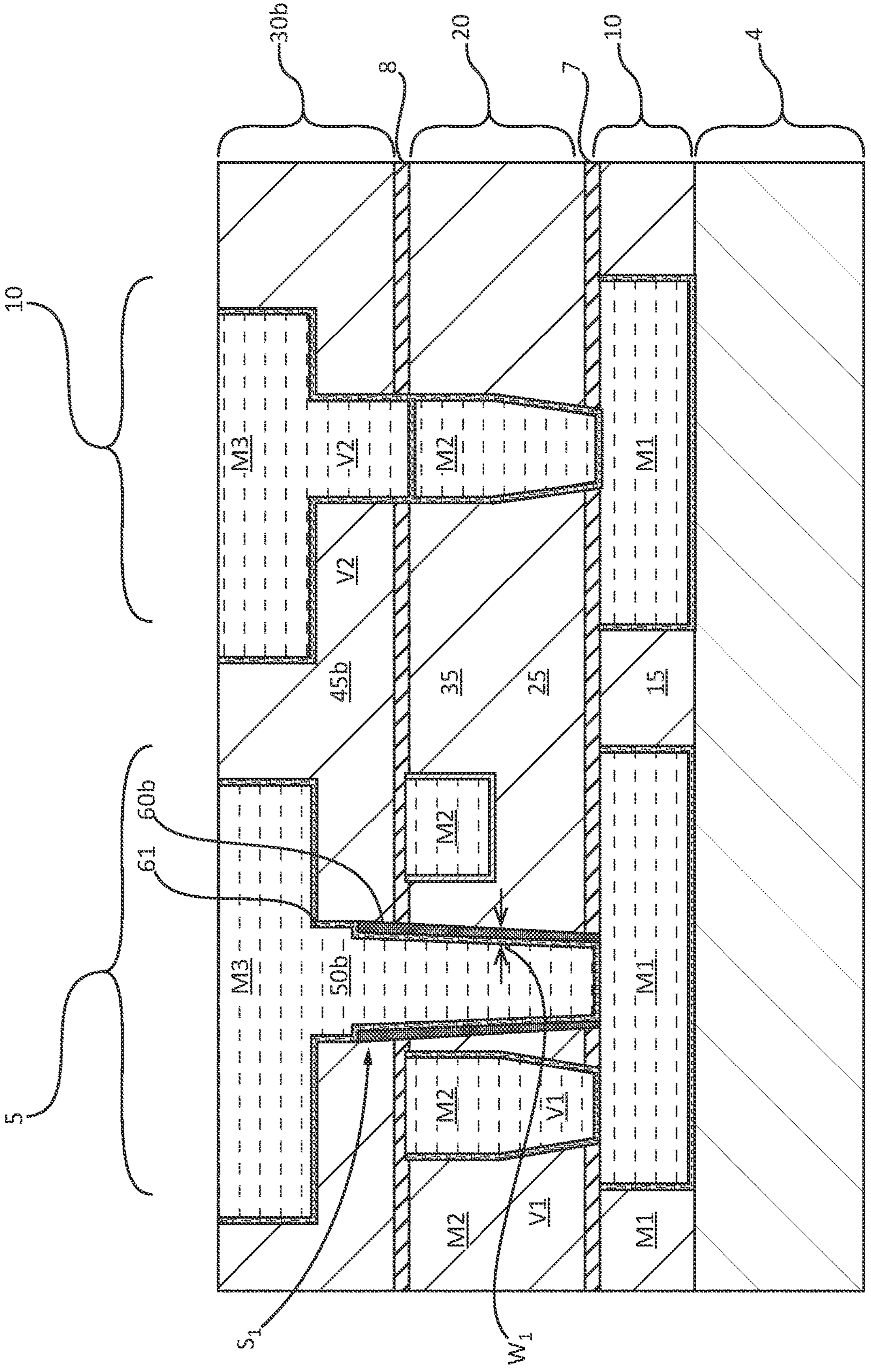
FIG. 2 is a side cross-sectional view of a second embodiment of an electronic structure including a skip via, in which the skip via includes an inner spacer that extends along only a lower portion of the height of the via opening and the skip via is formed using a dual damascene process, in accordance with one embodiment of the present disclosure.

Referring to FIGS. 1 and 2, a microelectronic structure is provided including at least one skip via 50*a*, 50*b*. FIG. 1 illustrates microelectronic structures including four levels 10, 20, 30*a*, 40. FIG. 1 is a structure formed using a single damascene method. FIG. 2 illustrates a microelectronics structure including three levels 10, 20, 30*b*. FIG. 2 is a structure that is formed using a dual damascene method. Each level includes a dielectric layer and at least metal feature.

The metal features can be metal lines or metal vias, e.g., conductive vias (that are not skip vias) and skip vias. The structure depicted in FIGS. 1 and 2 include two regions 5, 10. One region, i.e., first region 5, includes a skip via 50*a*, 50*b*, whereas the second region 10 does not include a skip via. Referring to FIG. 1, in some embodiments, the adjacently stacked levels 10, 20, 30*a*, 40 may be separated by a cap layer 7, 8, 9. For example, a first cap layer 7 may be present between the first level 10 and the second level 20, whereas a second cap layer 8 may be present between the second level 20 and the third level 30*a*. Additionally, a third cap layer 9 may be present between the third level 30*a* and the fourth level 40. The cap layers 7, 8, 9 may be composed of a dielectric material. In some examples, the dielectric material may be selected from the group consisting of silicon carbon nitride (SiCN), silicon oxynitride (SiON), silicon nitride ($Si_xN_y$), silicon oxide ($SiO_2$) and combinations thereof. FIG. 2 illustrating a structure formed using a dual damascene method only includes the first two cap layers 7, 8.

Referring to FIGS. 1 and 2, in one embodiment, the microelectronic structure may include a first level 10 (which can be referred to as a "first metal layer". The first level 10 can include a first metal line M1. The first level 10 is illustrated including a first metal line M1 that is positioned in a first metal line level dielectric 15. The first level 10 may be atop a substrate level 4.

The term "substrate level" is not intended to limit the element to just a semiconductor substrate, such as a silicon substrate. The substrate level 4 may include devices, such as active devices, e.g., transistors and memory, as well as passive devices, e.g., capacitors, resistors, diodes and inductors. The substrate level 4 may also include some structures for providing electrical conductivity. The substrate level 4 may also be resultant structure that is provided when front end of the line (FEOL) processing is complete.

Still referring to FIGS. 1 and 2, at least two least two metal lines M2, M3 are located above the first metal layer 10. In some embodiments, a first conductive via V1 is present connecting the metal lines M2 from the second level 20 to the first metal line M 1 within the metal line level 10. When using the term "conductive via" without further characterizing using the terms "skip" and/or "super", the via is an electrically conductive structure that extends only across one level of dielectric to a metal line. For example, if there are four dielectric containing levels 10, 20, 30*a*, 40 each including at least one conductive feature, e.g., metal line and/or metal via, a via that is not a skip via or super via would extend from one metal feature to a second metal feature across only one dielectric layer. For example, referring to FIGS. 1 and 2, the first conductive via V1 extents from a first metal line M1 to a second metal line M2 across a single dielectric layer, e.g., first via level dielectric layer 25.

Referring to FIG. 1, a third metal line M3 can be located in a fourth level 40 that are above the second metal line M2 in the second level 20. Separating the fourth level 40 including the third metal line M3 from the second level 20 including the second metal line M2 is a third level 30*a* that includes a second conductive via V2. The second conductive via V2 is a second example of a conductive metal via, which is not a skip via or super. The second conductive via V2 connects the third metal line M3 to the second metal line M2 on one side of the structure, i.e., the side not including a skip via, such as the second region 10. The second conductive via V2 is only extending through a single dielectric layer, e.g., second via level dielectric layer 45*a*.

In FIG. 2, the third metal line M3 is present in a dielectric 45*b* of a third level 30*b* processed using dual damascene methods.

Referring to FIGS. 1 and 2, the first region 5 of the structure may include a skip via, which is designated with reference number 50*a*. In some embodiments, a liner 60 is located on the walls of the skip via 50*a*. The liner 60 is only on the sidewalls S1 of the skip via 50*a*, and is not present at the horizontal face of the base of the skip via 50*a*. The material of the liner 60 is not present liner between the conductive material of the skip via 50*a* and either the third metal line M3 and the first metal line M1. In some examples, because the liner 60 is vertically orientated, i.e., extending along only vertical lengths of the sidewalls for the skip via 50*a*, the liner 50 may be referred to as an "inner spacer". The inner spacer 60 may be composed of a dielectric material. For example, the inner spacer 60 may be composed of an oxide or nitride dielectric. For example, the inner spacer 60 may be composed of silicon oxide ($SiO_2$), silicon nitride, silicon oxynitride, aluminum oxide, and low-k dielectrics, as well as combinations thereof.

The low-k inner spacers 60 typically have a dielectric constant that is less than the dielectric constant of silicon oxide, e.g., being less than 4.0, e.g., 3.9 or less. Examples of materials suitable for the inner spacers 60 include organosilicate glass (OSG), fluorine doped silicon dioxide, carbon doped silicon dioxide, porous silicon dioxide, porous carbon doped silicon dioxide, spin-on organic polymeric dielectrics (e.g., SILK™), spin-on silicone based polymeric dielectric (e.g., hydrogen silsesquioxane (HSQ) and methylsilsesquioxane (MSQ), and combinations thereof.

The width W1 of the inner spacer 60 may range from 1 nm to 10 nm. However, in some embodiments to provide an acceptable trade off as protection against surging without reducing the cross section of the electrically conductive feature 56 of the skip via 50*a*, the width W1 of the inner spacer 60 may range from 2 nm to 5 nm.

In some embodiments, the methods and structure of the present disclosure form the inner spacer 60 on the sidewall of the skip vias 50*a*, 50*b* to prevent shorting between skip via (SV) and metal lines, while still meeting the critical dimension (CD) target. For example, the inner spacer 60 may be positioned to be between the electrically conductive features, i.e., conductive fill 56, of the skip via 50*a*, and the second metal lines M2, as depicted in the first region 5 of the structure depicted in FIGS. 1 and 2. This provides that the inner spacer 60 protects the skip via 50*a* from shorting to the second metal lines M2, while providing for electrical communication from the third metal line M3 to the first metal line M1. It is noted, that only the super via 50*a* has inner spacer 60. The inner spacer 60 is not present on the sidewalls of the regular vias, e.g., first conductive via V1 and second conductive via V2.

The structures depicted in FIG. 1 may be formed using a single damascene forming method. The structures depicted in FIG. 2 may be formed using a dual damascene method.

Referring first to FIG. 1, in being formed using a single damascene method, the electrical communication structure can include at least two interlevel dielectric containing levels, e.g., first level 10, second level 20, third level 30*a* and fourth level 40, atop a substrate level 4 that includes electrical contact features. The interlevel dielectrics containing levels each include one interlevel dielectric layer 25, 35, 45*a*, 55. The interlevel dielectric layers 25, 35, 45*a*, 55 may each have a composition selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H).

A skip level via 50*a* is present in a skip level region (also referred to as first region 5) of the electrical communication structure. The skip level via 50*a* extends from an upper level metal line, e.g., third metal line M3, in an upper level of the at least two interlevel dielectric levels through a first interlevel dielectric level 35, 35 to a first metal line M1 that is directly on the substrate level 4 without contacting an interlevel metal line M2. The interlevel metal line (also referred to as second metal line) is positioned between the first and third metal lines M1, M3 in the stack of the interlevel dielectrics.

In some embodiments, the skip level via 50*a* includes an electrically conductive fill 56, and a via liner 61. The electrically conductive fill 56 may be copper (Cu). It is noted that copper is only one example of the composition for the electrically conductive fill 56. In other embodiments, the electrically conductive fill 56 may be composed of a metal selected from the group consisting of aluminum (Al), tantalum (Ta), tungsten (W), cobalt (Co) and platinum (Pt). The via liner 61 is a conformal structure and may include a bilayer of a barrier layer and a liner. The barrier layer may be a metal nitride such as tantalum nitride (TaN) or tungsten nitride (WN). In other examples, the barrier layer may be composed of titanium (Ti), titanium nitride (TiN), molybdenum nitride (MoN), tungsten silicon nitride (WSiN), tungsten silicon (WSi), Nb, NbN, Cr, CrN, TaC, $TaCeO_2$, TaSiN, TiSiN, and combinations thereof.

The liner can be a seed layer and may be a metal, such as cobalt (Co). In one example, the electrically conductive features that provide the skip level via 50*a* include a barrier layer of tantalum nitride (TaN) and a liner layer of cobalt (Co) for the via liner 61 which an electrically conductive fill 56 of copper (Cu).

In some embodiments, the skip level via 50*a* extends into electrical contact with a first element of electrical contact features, e.g., first portion of the first metal line M1, in a lower level of the at least two interlevel dielectric levels. The skip level via 50*a* can include a spacer 60 that is present on sidewalls of the skip level via 50*a*. The spacer 60*a* is only on the sidewalls S1 of the skip via 50*a*, and is not present at the horizontal face of the base of the skip via 50*a*. The material of the spacer 60 is not present liner between the conductive material of the skip via 50*a* and either the third metal line M3 and the first metal line M1. In some examples, because the liner 60*a* is vertically orientated, i.e., extending along only vertical lengths of the sidewalls for the skip via 50*a*, the spacer 60*a* may be referred to as an "inner spacer". The inner spacer 60*a* may be composed of a dielectric material. For example, the inner spacer 60*a* may be composed of an oxide or nitride dielectric. For example, the inner spacer 60 may be composed of silicon oxide (SiO2), silicon nitride, silicon oxynitride, aluminum oxide, and low-k dielectrics, as well as combinations thereof.

In some examples, the inner spacer 60*a* extends along an entire height of the skip level via sidewall, as depicted in FIG. 1. For example, referring to FIG. 1, the inner spacer 60*a* may be in direct contact with an upper surface of the first metal liner ml at the point the inner spacer 60*a* is directly abutting the sidewall of the via, and extends along the sidewall of the via through the interlevel dielectrics having referenced numbers 25, 35, 45 into direct contact with the bottom surface of the third metal line M3. The inner spacer 60*a* extends continuously from between the first and third meal lines M1, M3 along the via sidewalls. The structure depicted in FIG. 1 is formed using a single damascene process.

In the example depicted in FIG. 1, the inner spacer 60*a* is present on a portion of the upper surface of the first metal line M1 having a width as wide W1 as the inner spacer 60*a*, e.g., ranging from 1 nm to 10 nm, and in some embodiments ranging from 2 nm to 5 nm. This is only portion of the inner spacer 60 that is present on the horizontal surface of the first metal line M1, which is from the width of the inner spacer 60 that is directly abutting the sidewall of the interlevel dielectrics 25, 35, 45 that have been opened, i.e., etched, to provide the via opening. The remainder of the upper surface, i.e., horizontal surface, of the first metal line M1 is entirely free of the material that provides the inner spacer 60*a*.

The electrical communications structure depicted in FIG. 1 can further include a single level via V1 extending from the interlevel metal line M2 into electrical contact with at least a second element of the electrical contact features, e.g., second portion of the first metal line M1. The single level via V1 can also be referred to as a conductive via, i.e., a via that is not a skip level via. The single level via V1 that is described above as being in contact with a different portion of a metal feature, e.g., first metal line M1, from the portion of the metal feature, e.g., first metal line M1, that the skip level via 50*a* is in contact with may be present in the first region 5 of the electrical communication structure. It is noted that the structure may include a second region 10 that is completely free of skip vias 50*a* and only includes single level vias V1, V2.

As illustrated in FIG. 1, the inner spacer 60*a* that is present in the skip level via 50*a* only, and is not present in the single level vias V1, V2. More specifically, the dielectric material of the spacer 60*a* for the skip level via 50*a* is not present on the sidewalls of the single level via V1, V2.

In some examples, the above described structure may be formed using a single damascene method.

In another embodiment, an electrical communication structure is provided that includes a skip level via having a spacer on only a portion of the sidewalls of the skip level via opening. In this embodiment, the electrical communication structure may be formed using a dual damascene method, as depicted in FIG. 2.

FIG. 2 illustrates a structure formed using a dual damascene method. The skip via 50*b* in this structure does not extend along an entire height h1 of the skip via 50*b*. In some embodiments, for skip vias 50*b* formed as part of a dual damascene process, the inner spacer 60*b* is present only on a lower portion of the skip via sidewall, as depicted in FIG. 2. In some examples, the electrical communication structure includes a skip level via 50*b* extending from an upper level metal line M3 in an upper level of the at least two interlevel dielectric levels, e.g., a third level 30*b* including a third dielectric layer 45*b*, through at least one interlevel dielectric level that is on the substrate level without contacting an interlevel metal line. For example, the skip via 50*b* may extend through three interlevel dielectric layers 45*b*, 35, 25, while extending from the lower surface of the third metal line M3 to the first metal line M1. As illustrated in FIG. 2, while the third metal line M3 is present in a third (upper) level 30*b* including an interlevel dielectric layer identified by reference number 45*b*, and the first metal line M1 is present in a first level identified by reference number 10 including an interlevel dielectric layer identified by reference number 15; the skip via 50*b* extends through interlevel dielectric layers identified by reference numbers 25 and 35 in the second level 20. It is further noted that the second level 20 includes a second metal line M2 and a conductive via V1. The skip via 50*b* extends through the interlevel dielectric layers 25, 35 without being shorted with the metal features, e.g., the second metal liner M2 and the conductive via.

To protect the skip via 50*b* from shorting to other metal features. Different from the spacer 60*a* for the via formed using the single damascene method depicted in FIG. 1, the spacer 60*b* that is formed using the dual damascene method does not extend along an entire height H1 of the via. The skip level via 50 for the includes a spacer 60*b* that is present on a lower portion of sidewalls of the skip level via opening. As will be further described in the method for forming the skip level via 50*b* using a dual damascene process, during the dual damascene process the height of the inner spacer 60*b* is recessed.

Still referring to FIG. 2, the electrical communications structure that is provided using the dual damascene process can further include a single level via V1 extending from the interlevel metal line M2 into electrical contact with at least a second element of the electrical contact features, e.g., a second portion of the first metal line M1. Similar to the skip via 50*a* depicted in FIG. 1, the dielectric material of the spacer 60*b* for the skip level via 50*b* depicted in FIG. 2 is not present on the sidewalls of the single level via V1, V2.

FIGS. 3-7 illustrate one embodiment for forming a skip via 50*a* with a single damascene method. FIG. 1 is a side cross-sectional view of a first embodiment of an electronic structure including a skip via, in which the skip via includes an inner spacer that extends along an entire height of the via opening and the skip via is formed using a single damascene process. The initial structure can include the first, second and third levels 10, 20, 30*a*, as well as a first metal line M1 in the first level 10, a second metal line M2 in the second level 20, and a second metal line M2 in the second level 20. A third level 30*a* is present atop the second level 20. Still referring to FIG. 1, a skip level via opening 70 may be formed using photolithography and etch processes. The skip level via opening 70 is present in the first region 10 of the initial structure depicted in FIG. 3, and extends from the third level 30 to the metal line M1 in the first level 10.

The skip level via opening is formed using photolithography and etch processes. For example, a pattern is produced by applying a photoresist to the surface to be etched; exposing the photoresist to a pattern of radiation; and then developing the pattern into the photoresist utilizing conventional resist developer. Once the patterning of the photoresist is completed, the sections covered by the photoresist are protected while the exposed regions are removed using a selective etching process that removes the unprotected regions. The unprotected regions removed by the etch process provides the skip level via opening 70.

Figure 3:
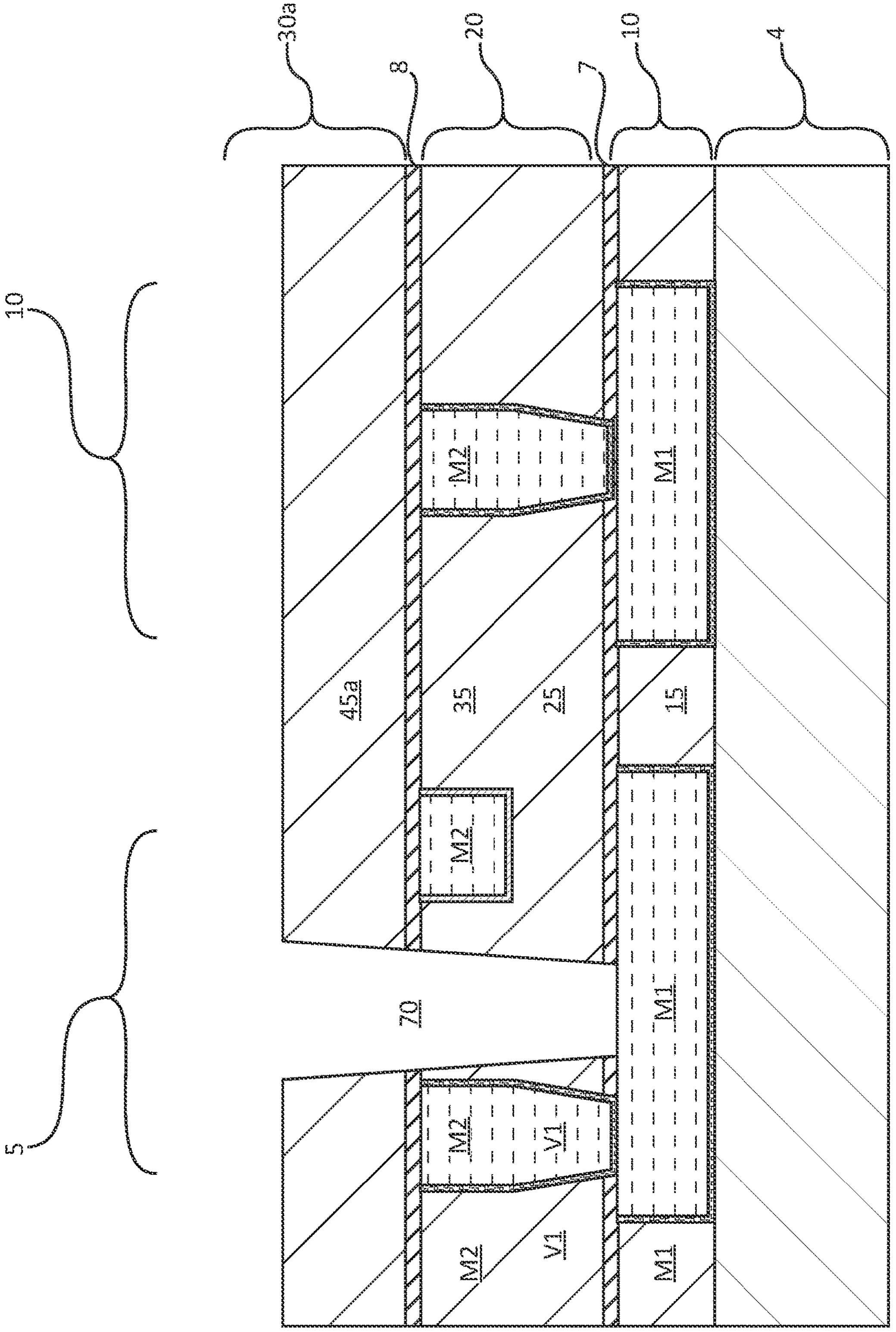
FIG. 3 is a side cross-sectional view of an initial structure employed in a single damascene method for forming an electronic structure including a skip via, in accordance with one embodiment of the present disclosure.
Figure 4:
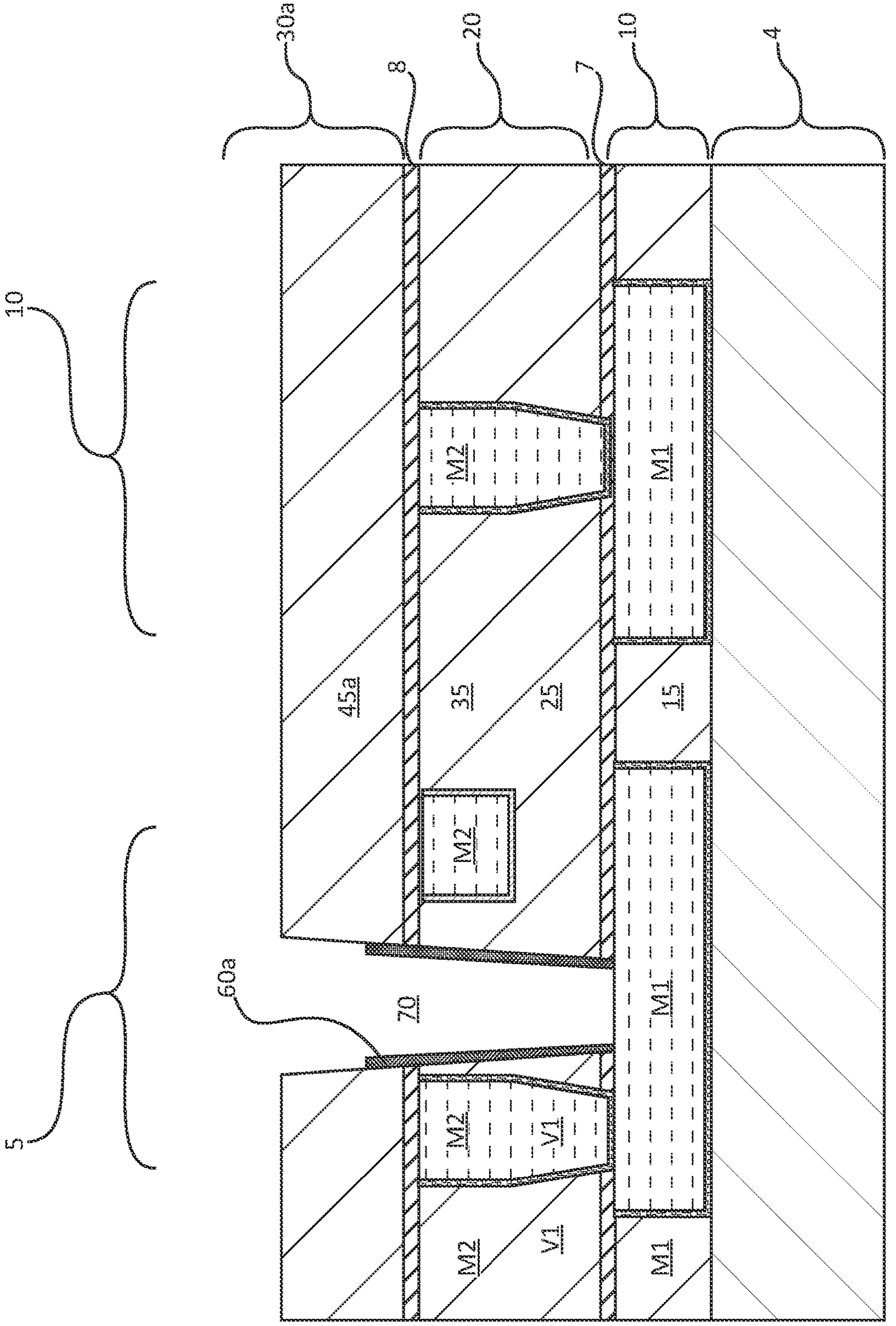
FIG. 4 is a side cross-sectional view of forming an inner spacer on the sidewalls of the skip via depicted in FIG. 3.

FIG. 4 depicts one embodiment of forming an inner spacer 60*a* on the sidewalls of the skip via opening 70 depicted in FIG. 3. The inner spacer 60*a* provides a level of protection by obstructing the subsequently formed electrically conductive features for the skip level via 50*a* from contacting the second metal line M2 in the second level 20 of the structure. The inner spacer 60*a* may be formed using a deposition process, such as chemical vapor deposition (CVD). Chemical vapor deposition (CVD) is a deposition process in which a deposited species is formed as a result of chemical reaction between gaseous reactants at greater than room temperature; wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (PECVD), Metal-Organic CVD (MOCVD) and combinations thereof may also be employed. In other embodiments, the inner spacer 60*a* may be formed using atomic layer deposition (ALD).

The material layer for the inner spacer 60*a* may be blanket deposited as a conformal layer, wherein following deposition, a directional etch process may be applied to remove all horizontally orientated portions of the blanket layer, wherein the vertically orientated portions remain to provide the inner spacer 60*a*. The directional etch process may include reactive ion etching.

Figure 5:
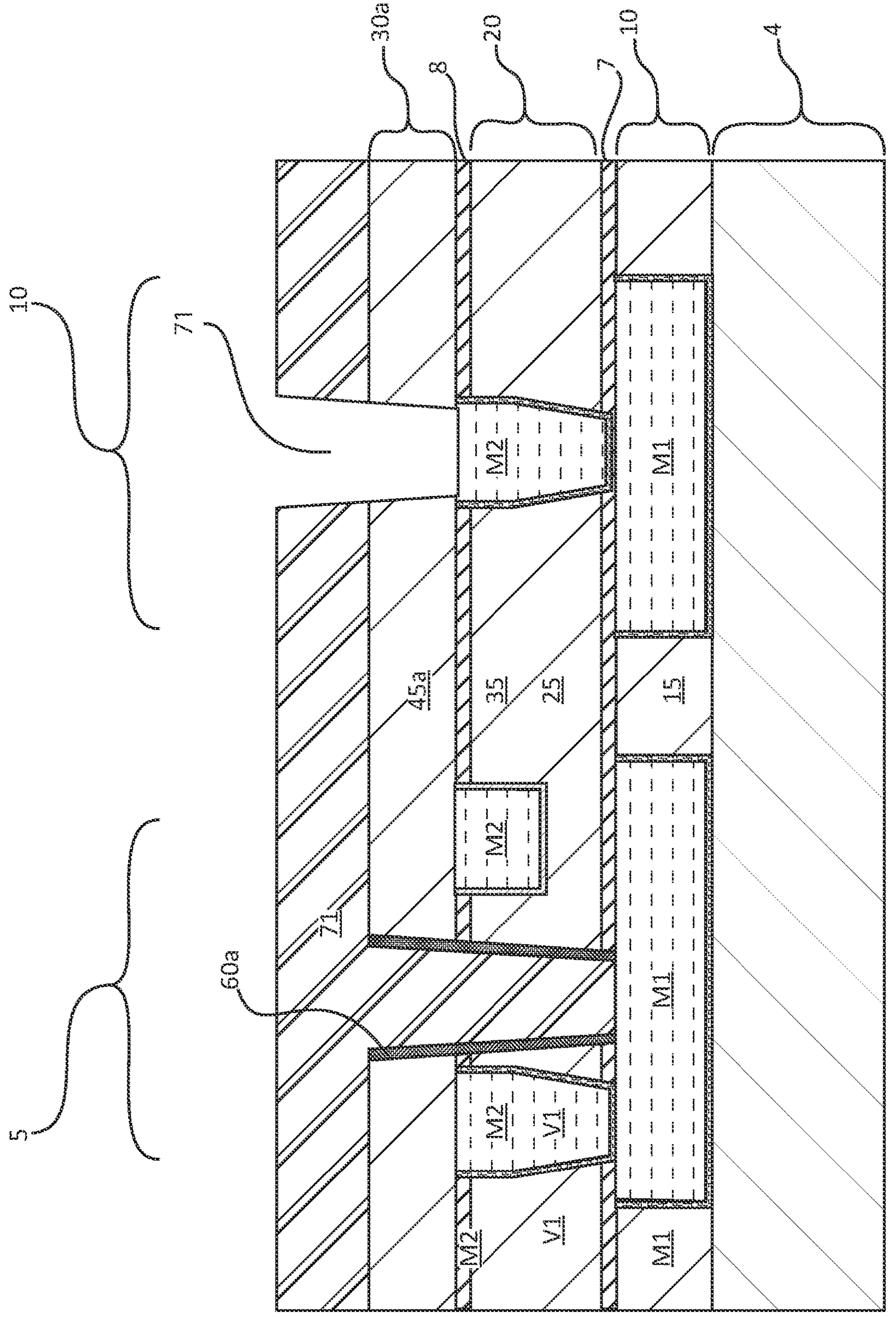
FIG. 5 is a side cross-sectional view depicting forming a mask over the skip via in a first region of the substrate and forming an opening for an electrically conductive via in a second region of the substrate, in accordance with one embodiment of the present disclosure.

FIG. 5 depicts forming a block mask 71 over the skip via opening 70 in a first region 5 of the substrate and forming an opening 72 for an electrically conductive via in a second region 10 of the substrate 4. First, a block mask 71 is formed protecting the first region 5, where the skip via 50*a* is formed. The exposed portion of the substrate that is not protected by the block mask 71 is subsequently processed to provide the opening 72 for the electrically conductive via in the second region 10.

The block mask 71 may comprise soft and/or hardmask materials and can be formed using deposition, photolithography and etching. In a preferred embodiment, the block mask 50 comprises an organic planarization layer (OPL). A block mask 71 comprising a OPL material may be formed by blanket depositing a layer of OPL material; providing a patterned photoresist atop the layer of OPL material; and then etching the layer of POL material to provide a block mask 7.

Following the formation of the block mask 7, the opening 72 for the electrically conductive via within the second region 10 is formed using etch processing. In the embodiment depicted in FIG. 5, a directional etch process, such as reactive ion etching (RIE), may be employed to etch through the interlevel dielectric layer identified by reference number 45*a*, and the cap layer designated with reference number 8 to provide the opening exposing an upper surface of the second metal line M2 within the second level 20.

Figure 6:
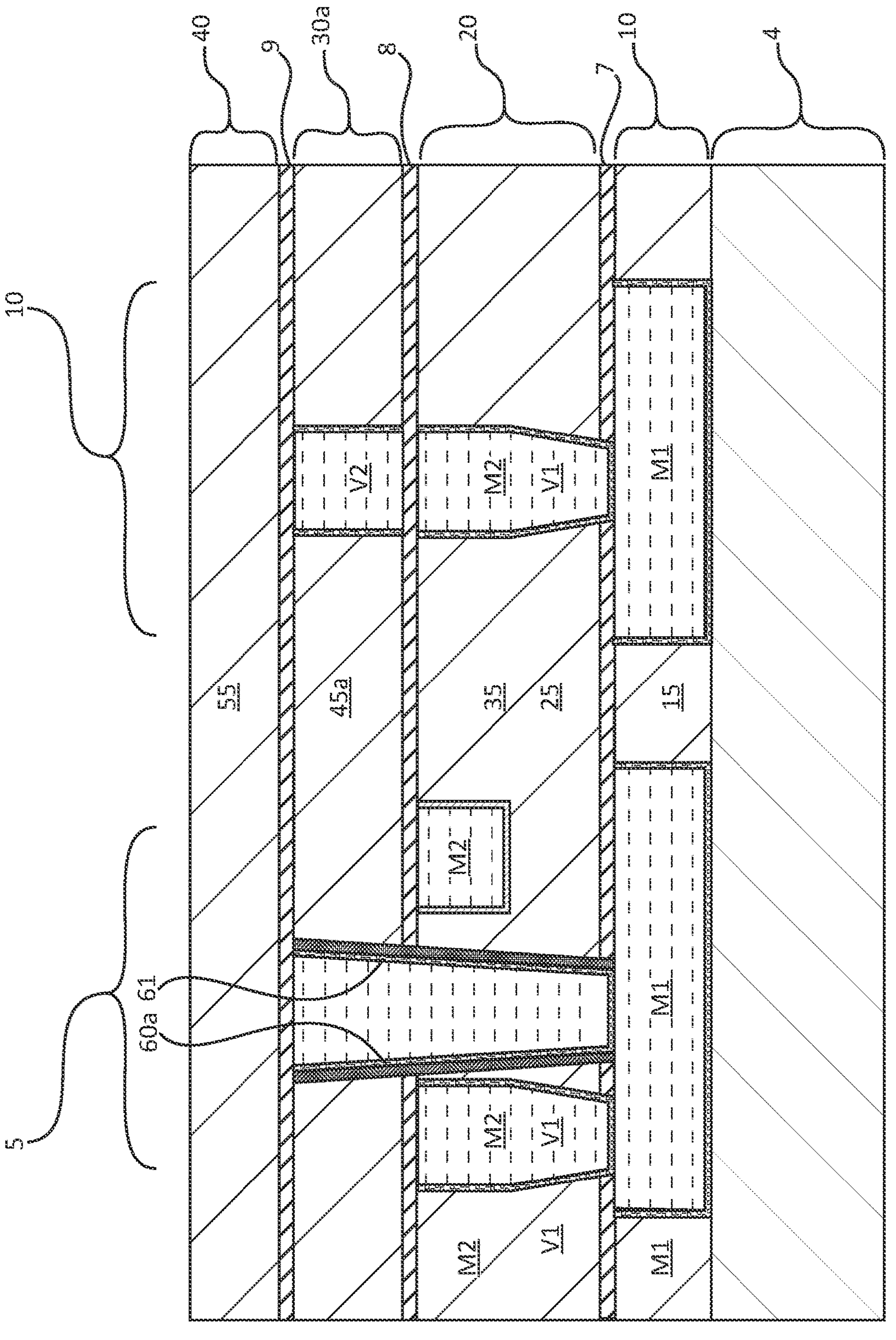
FIG. 6 is a side cross-sectional view depicting forming the electrically conductive features for the skip via in the first region of the device and an electrically conductive via in a second region of the substrate, and forming an upper level including an interlevel dielectric, in accordance with one embodiment of the present disclosure.

FIG. 6 depicts forming the electrically conductive features 56, 61 for the skip level via 50*b* in the first region 5 of the device and an electrically conductive via V2 in a second region 10 of the device. Following via opening formation 70, 71, the electrically conductive features for the vias can formed by depositing a conductive metal into the via holes using deposition methods, such as CVD or plating, e.g., electroplating or electroless plating. The conductive metal provides the metal fill 56 and may include, but is not limited to: tungsten, copper, aluminum, silver, gold and alloys thereof.

In some embodiments, priors to forming the metal fill 56, a bilayer 61 may be deposited on the sidewalls and vase of the via openings 70, 71. The bilayer may include a barrier layer and a liner, e.g., adhesion of seed layer. In some examples, the bilayer 61 includes a barrier layer of a metal nitride, such as tantalum nitride, and a liner of cobalt (Co). The bilayer 61 may be deposited by chemical vapor deposition, atomic layer deposition, plating (including electroplating), as well as physical vapor deposition, e.g., sputtering. The bilayer 61 may be a conformally deposited layer and can be formed on both the sidewalls and base of the via openings, as well as the base and sidewalls of trenches for metal lines, where applicable.

FIG. 6 also depicts forming an upper level 50 including an interlevel dielectric 55 for an upper level and a cap dielectric 9. Before forming the upper level 50, the structure depicted in FIG. 5 may be planarized. Planarization may include chemical mechanical planarization (CMP). Thereafter, the dielectrics for the interlevel dielectric 55 and the cap dielectric 9 may be deposited.

Figure 7:
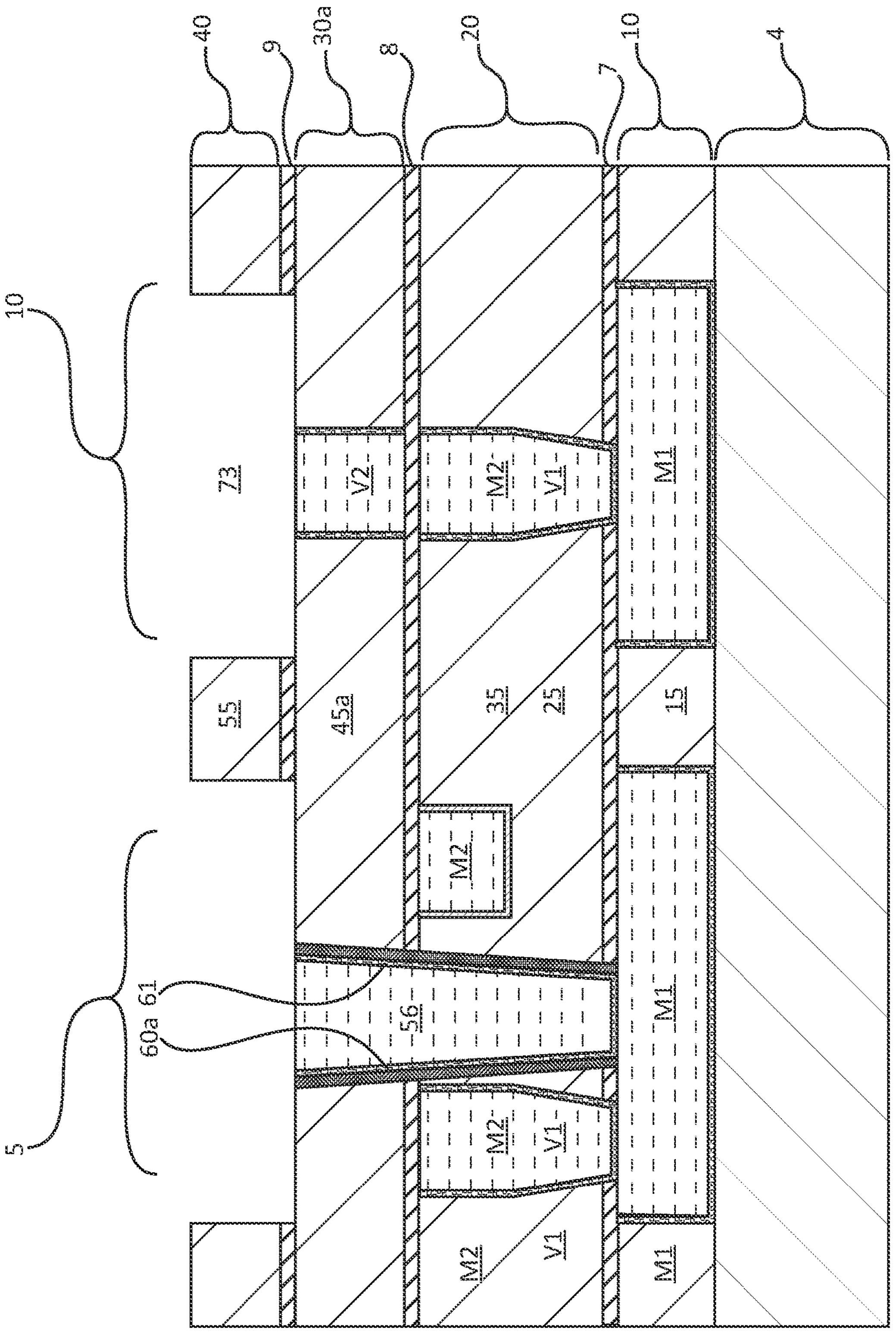
FIG. 7 is a side cross-sectional view of forming trenches in the interlevel dielectric of the upper level, in which the trenches are for forming metal lines, in accordance with a single damascene embodiment of the present disclosure.

FIG. 7 depicts one embodiment from forming trenches 73 in the interlevel dielectric 55 of the upper level 40, in which the trenches are for forming metal lines M3, in accordance with a single damascene method. Similar to forming via openings, the trenches 73 for the metal lines M3 are formed using deposition, photolithography and etch processes. In the single damascene process, the trenches and vias are formed one step at a time. In contrast, they are formed simultaneously in dual damascene. For each via and line level, a separate mask and etch step is employed in a single damascene process. The etch mask for the trenches may be a photoresist mask. The etch process for forming the trenches may be reactive ion etching.

Referring back to FIG. 1, in a following process sequence, the trenches 73 for the third metal line M3 may be filled with electrically conductive material. Similar to the description of filling the skip level via 50*a* and the electrically conductive via V2 (single level via) described above, the electrically conductive fill for the third metal line M3 can include a bilayer, e.g., a barrier layer of a metal nitride, such as tantalum nitride (TaN), and a liner of cobalt (Co). Following the bilayer, the majority of the fill may be provided by a copper (Cu) fill. The electrically conductive materials may be deposited using chemical vapor deposition, physical vapor deposition, atomic layer deposition and/or plating. The deposited materials can be planarized using chemical mechanical planarization.

It is noted that the process sequence described using FIGS. 1 and 3-7 is provided for illustrative purposes only. Other preliminary steps, intermediary steps, as well as concluding steps may be added to the process sequence.

FIGS. 8-13 illustrate another embodiment of the present disclosure, which can provide an electrical communication structure including a skip level via having an inner spacer for providing improved performance, in which the electrical communication structure is formed using a dual damascene method.

Figure 8:
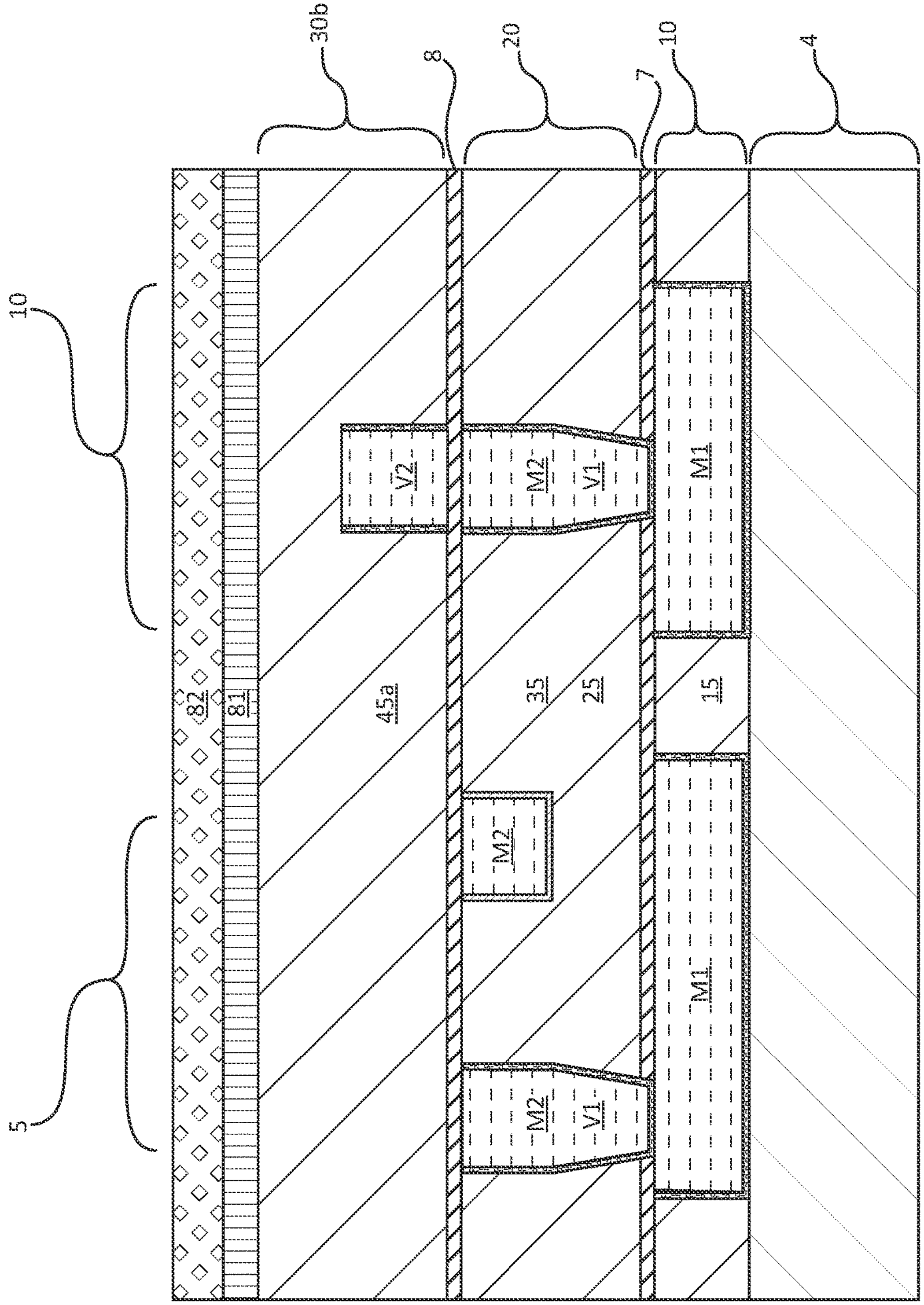
FIG. 8 is a side cross-sectional view depicting a photoresist layer and a hardmask layer being present atop the upper level of an initial structure used for forming an electrically conductive structure including a skip level via with inner spacer, in accordance with one embodiment of the present disclosure.

FIG. 8 illustrates one embodiment of an initial structure for a dual damascene process flow. In the embodiment depicted in FIG. 8, the substrate 4 and the first three levels 10, 20, 30*b* that are depicted are similar to these same structures having these same reference numbers in the embodiments that have been described with reference to FIGS. 1 and 3-7. Therefore, the above description of these structures with reference to FIGS. 1 and 3-7 is suitable for providing a description of the same structures having the same reference numbers in FIGS. 2 and 8.

Still referring to FIG. 8, in some embodiments, a photoresist layer 82 and a hardmask layer 81 is present atop the upper level 30*b*. The photoresist layer 82 and hardmask layer 81 are used in the dual damascene method. More particularly, the photoresist layer 82 and the hardmask layer 81 are used in combination for providing a metal line and via opening that can be subsequently filled together during the same electrically conductive fill processing steps.

Figure 9:
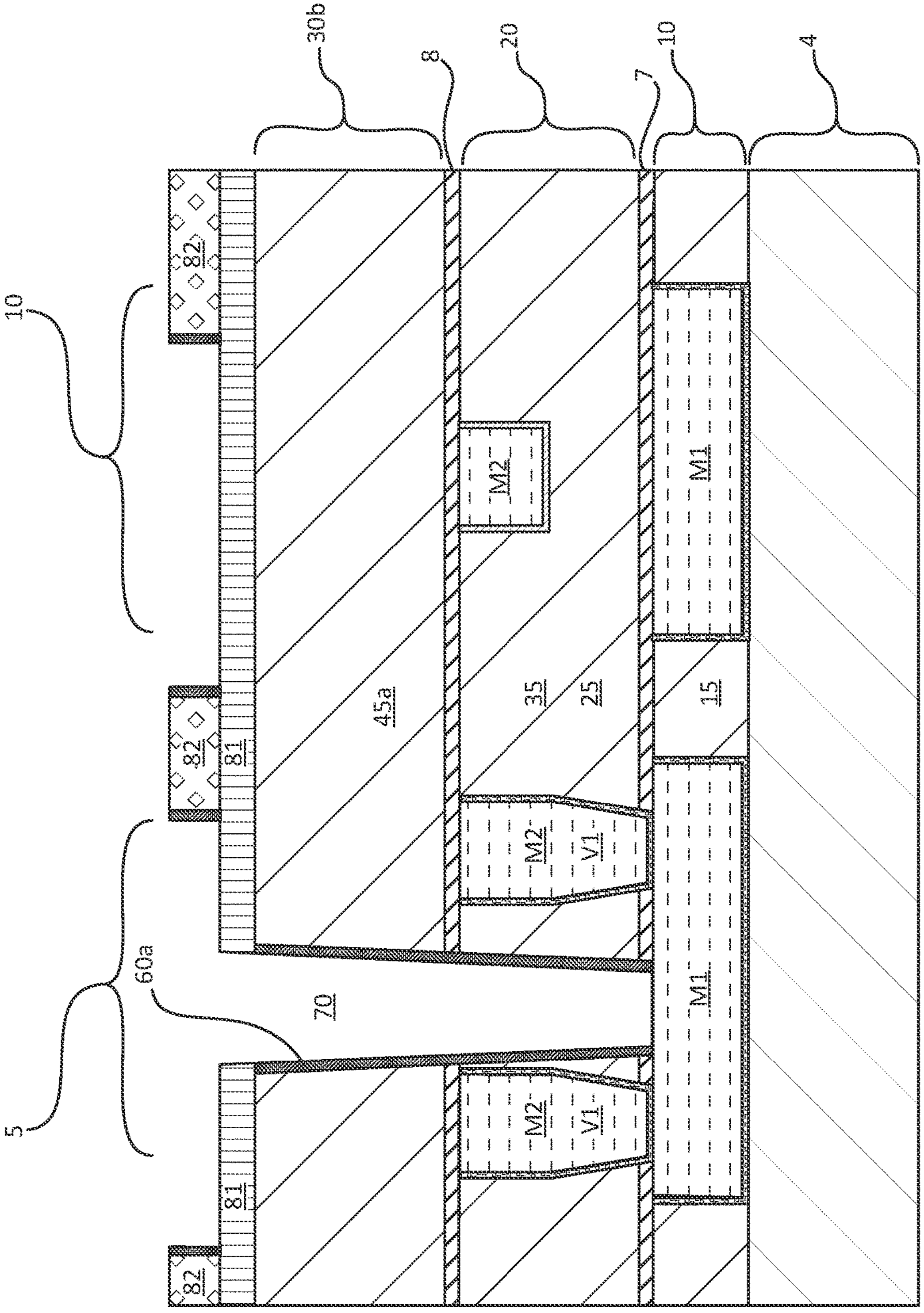
FIG. 9 is a side cross-sectional view depicting forming a skip level via opening in the structure depicted in FIG. 8, and forming an inner spacer on the sidewall of the skip level via opening.

Referring to FIG. 9, the photoresist layer 82 is first patterned to provide the geometry of the third metal line M3. The photoresist layer 82 exposes the hardmask layer 81. Within the opening that has been patterned within the photoresist layer 82, the hardmask layer 81 is patterned and etched to provide a mask for the skip level via opening 70. FIG. 9 illustrates etching a skip level via opening 70 that extends to the first metal line M1. FIG. 9 further depicts a process sequence of deposition and directional etching to provide the inner spacer 60*b*. The inner spacer 60*b* depicted in FIG. 9 is similar to the inner spacer 60*a* that has been described with reference to FIG. 4.

Figure 10:
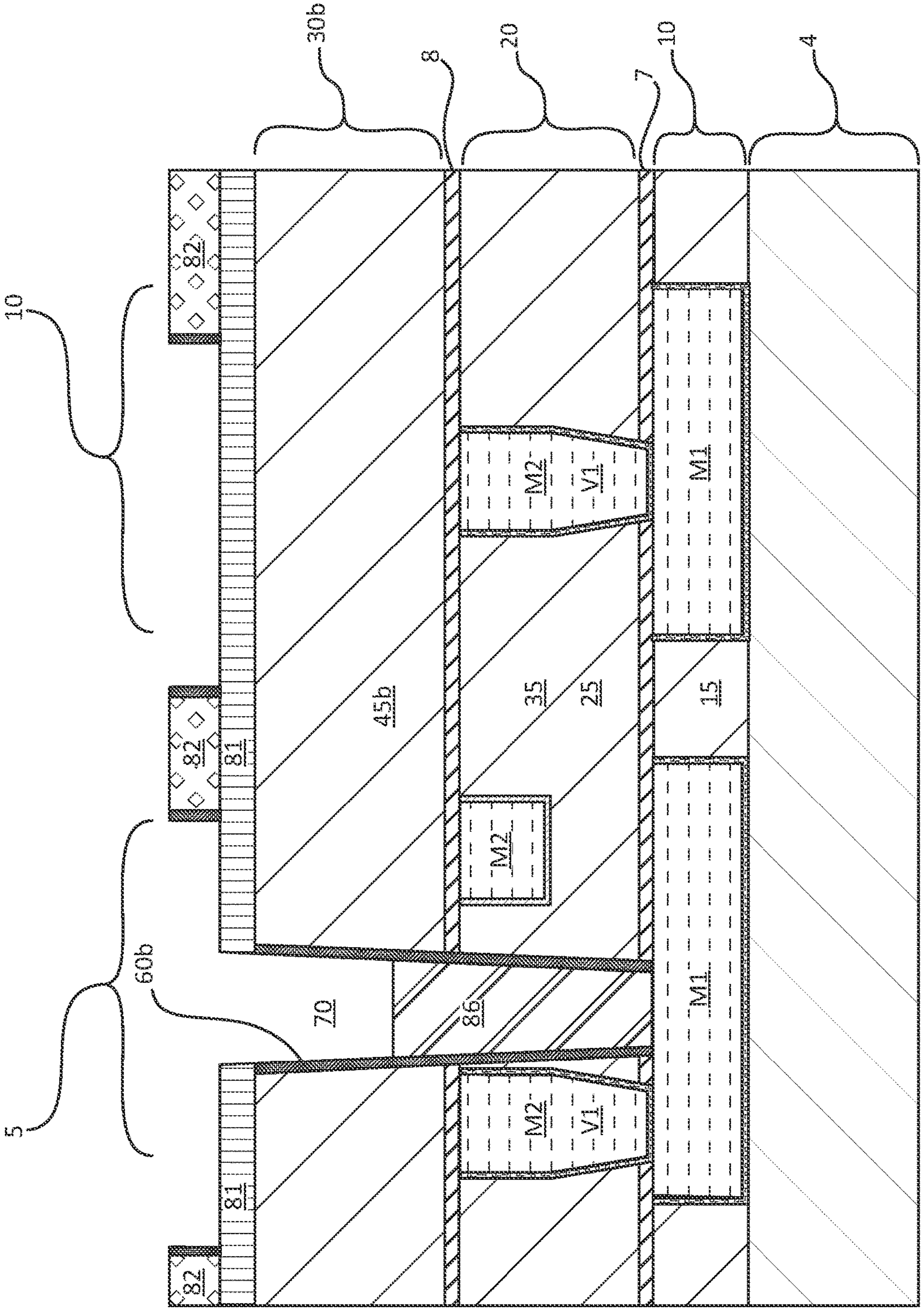
FIG. 10 is a side cross-sectional view depicting forming a block mask in the skip level via opening.

FIG. 10 illustrates forming a block mask 86 in the skip level via opening 70. The block mask 86 depicted in FIG. 10 is similar to the block mask having reference number 71 in FIG. 5. However, the block mask 86 depicted in FIG. 10 has been recessed to be within the skip level via opening 70.

Figure 11:
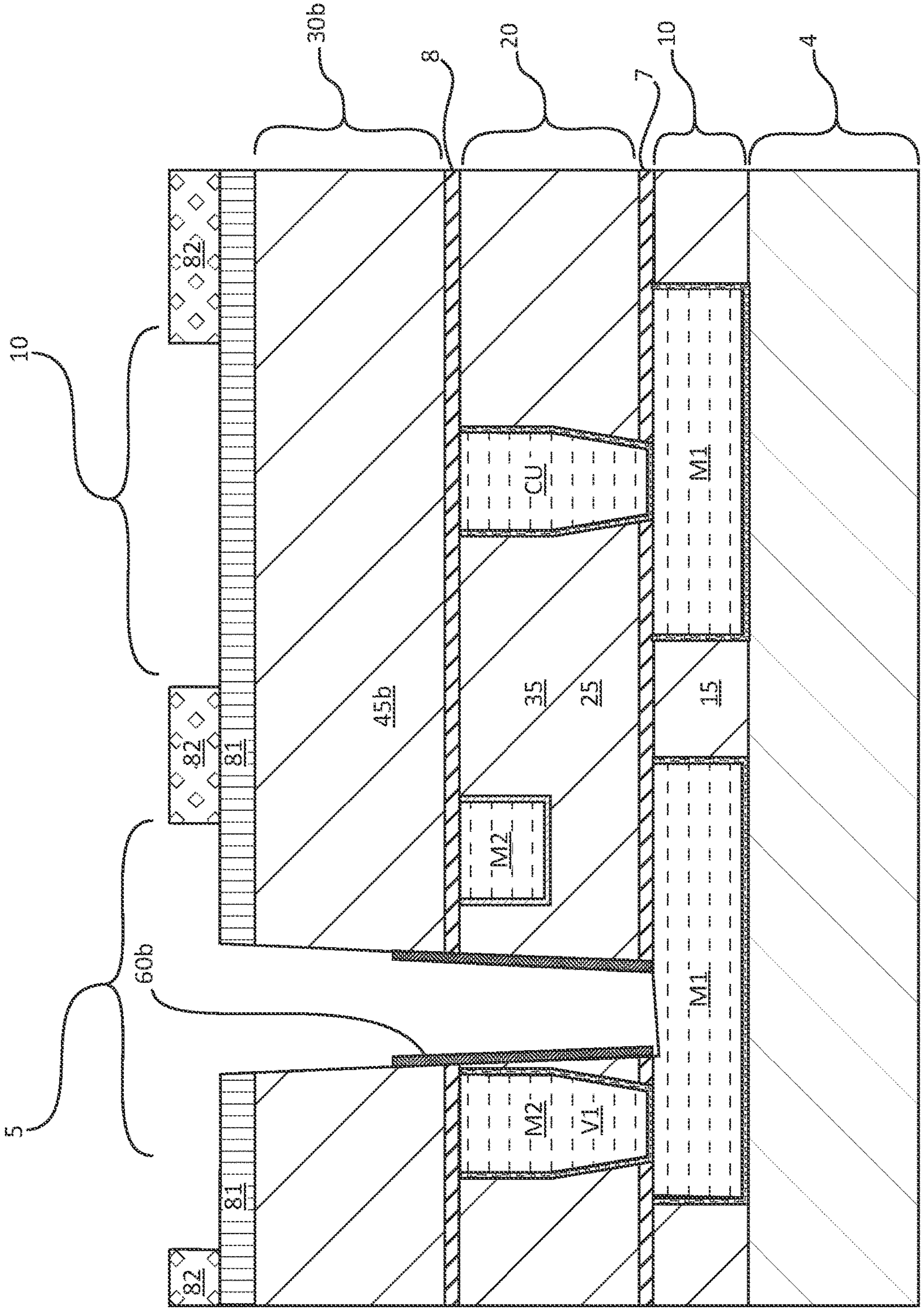
FIG. 11 is a side cross-sectional view depicting recessing the material the provides the inner spacer, in accordance with one embodiment of the present disclosure.

FIG. 11 depicting recessing the material the provides the inner spacer 60*b*. The dielectric that provides the inner spacer 60*b* may be recessed with a directional etch process. It is noted that the portions of the material for the inner spacer 60*b* that were present outside the skip level via opening 70 are completely removed by this etch step.

Figure 12:
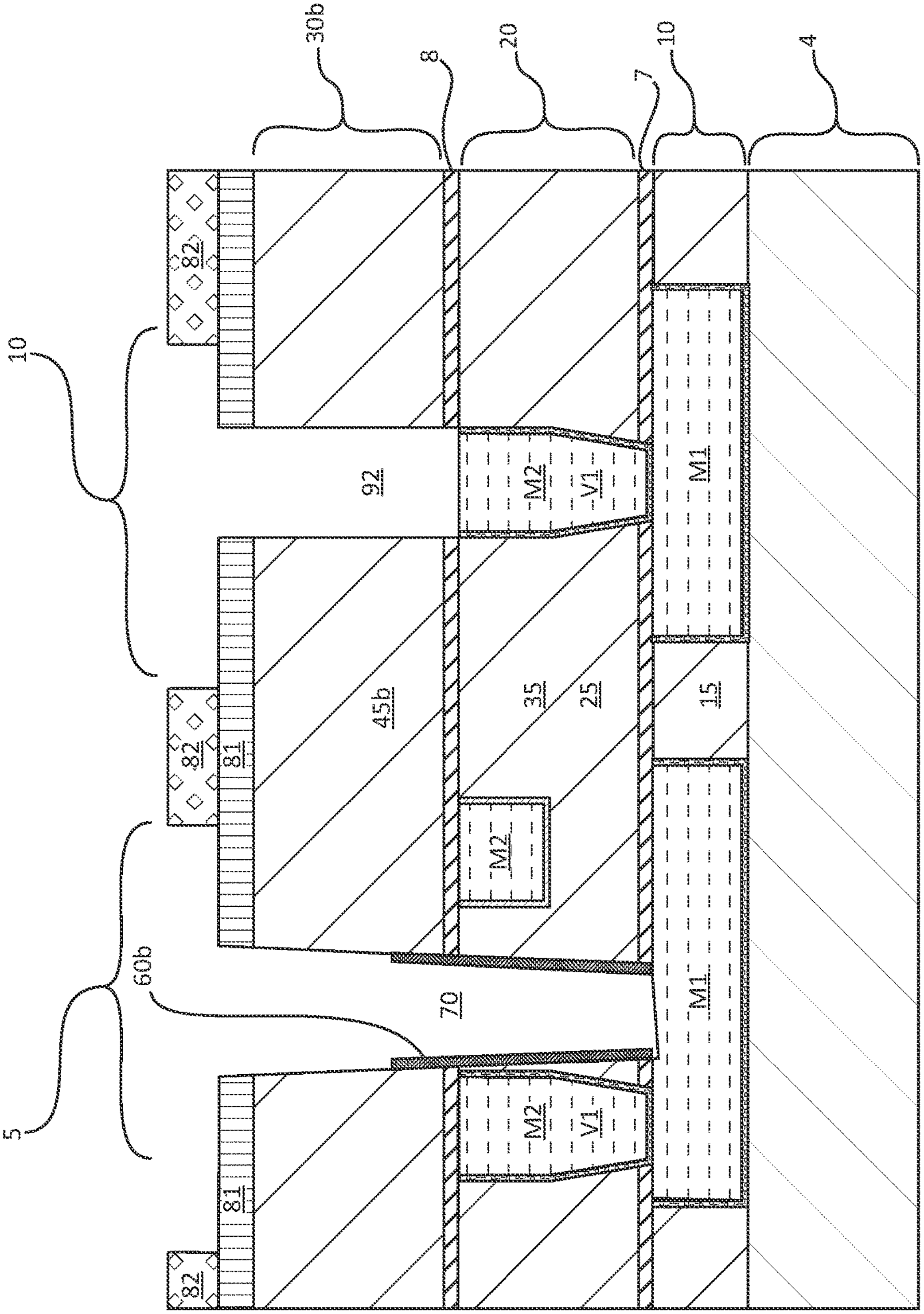
FIG. 12 is a side cross-sectional view illustrating forming the opening for a single level via in a region of the structure depicted in FIG. 11 that does not include a skip level via.

FIG. 12 illustrates one embodiment of forming the opening 92 for a single level via in a second region 10 of the structure that does not include a skip level via. Forming the opening 92 for the single level via in the second region 10 of the structure depicted in FIG. 12 is similar to forming the opening 71 for the single level via depicted in FIG. 5.

Figure 13:
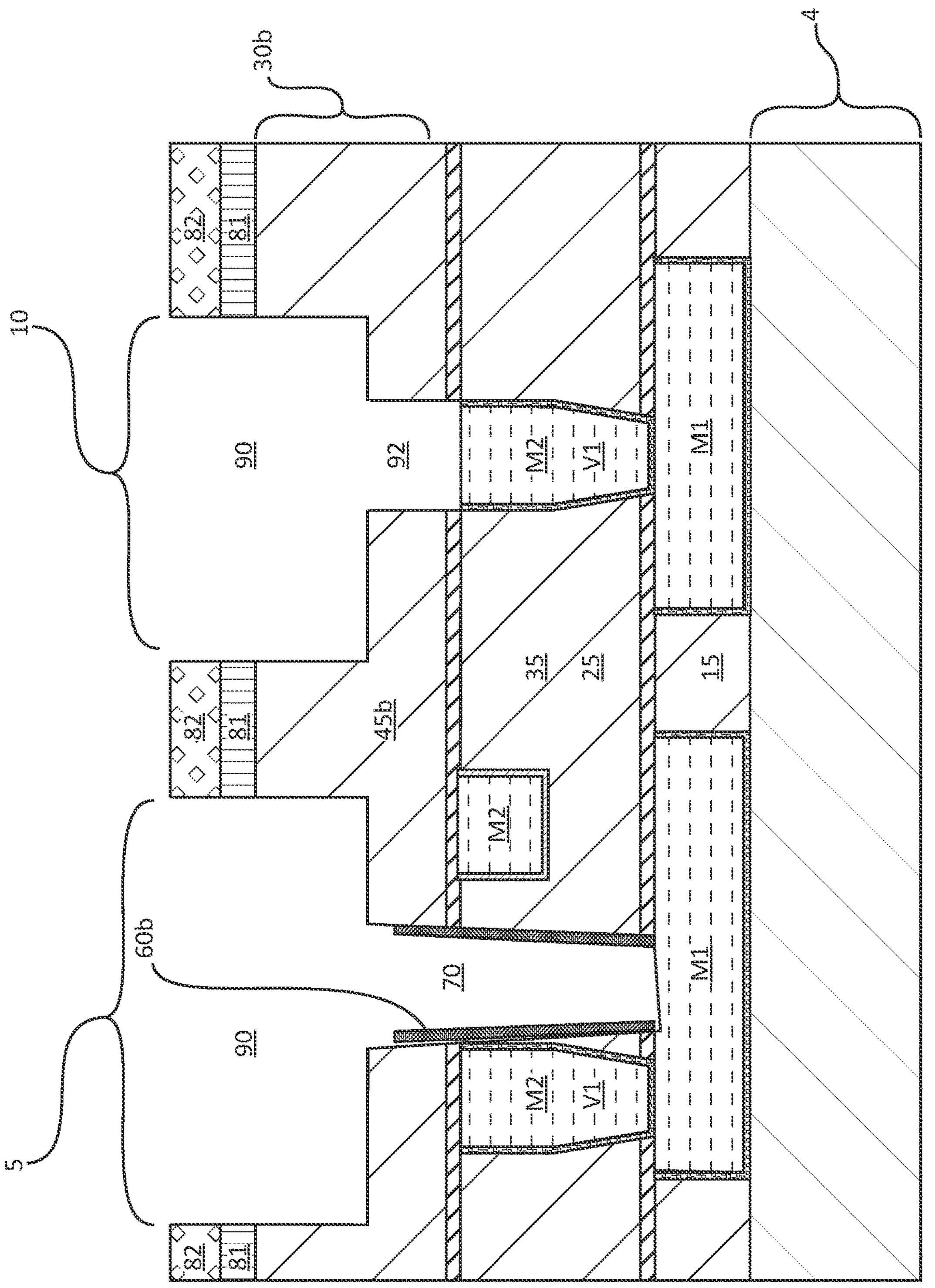
FIG. 13 is a side cross-sectional view illustrating forming the third metal lines in the third level of the device using a dual damascene method, in accordance with one embodiment of the present disclosure.

FIG. 13 illustrates forming the trenches 90 for the third metal lines in the third level 30 of the device using a dual damascene method. The interlevel dielectric layer 45*b* in the third level 30*b* is etched using the patterned photoresist layer 82 as an etch mask. During this etch process, exposed portions of the hardmask dielectric layer 81 may be removed.

Referring back to FIG. 2, the metal lines M3 and skip via 50*b*, V2 may be filled with electrically conductive material. Similar to the description of filling the skip level via 50*a* and the electrically conductive via V2 (single level via) described above in the single damascene method describe with reference to FIG. 1, the electrically conductive fill for the third metal line M3 can include a bilayer, e.g., a barrier layer of a metal nitride, such as tantalum nitride (TaN), and a liner of cobalt (Co). Following the bilayer, the majority of the fill may be provided by a copper (Cu) fill. The electrically conductive materials may be deposited using chemical vapor deposition, physical vapor deposition, atomic layer deposition and/or plating. The deposited materials can be planarized using chemical mechanical planarization. The planarization process can remove any remaining portions of the photoresist mask 82 and hard mask 81.

Having described preferred embodiments of a skip via with localized spacer, it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A microelectronics structure comprising:

a substrate level;

at least two interlevel dielectric levels on the substrate level, including a lower level and an upper level, the lower level including a plurality of electrical contact features, the at least two interlevel dielectric levels including an interlevel metal line and an upper level metal line above the interlevel metal line;

a skip level via extending from the upper level metal line in the upper level through at least one of the interlevel dielectric levels without contacting the interlevel metal line, wherein the skip level via extends into electrical contact with a first element of the plurality of electrical contact features in the lower level, wherein the skip level via includes a skip level via opening and a spacer comprising a dielectric material, the spacer being present on a lower portion of sidewalls of the skip level via opening, and wherein the spacer is recessed such that an upper portion of the sidewalls of the skip level via opening is free of the spacer; and a single level via extending from the interlevel metal line into electrical contact with at least a second element of the plurality of electrical contact features, wherein the dielectric material of the spacer is not present on sidewalls of the single level via.

2. The microelectronics structure of claim 1, wherein the dielectric material of the spacer is selected from the group consisting of silicon oxide, silicon nitride, silicon oxynitride, aluminum oxide, and combinations thereof.

3. The microelectronics structure of claim 1, wherein the dielectric material of the spacer is a low-k dielectric.

4. The microelectronics structure of claim 1, wherein the spacer has a thickness ranging from 2 nm to 5 nm.

5. The microelectronics structure of claim 1, wherein the spacer is positioned between an electrically conductive fill of the skip level via and the interlevel metal line to obstruct the skip level via from shorting to the interlevel metal line.

6. The microelectronics structure of claim 1, wherein the skip level via further comprises a via liner, the via liner being a conformal structure present on the sidewalls and a base of the skip level via opening, wherein, on the lower portion of the sidewalls of the skip level via opening, the via liner is between an electrically conductive fill of the skip level via and the spacer.

7. An electrical communication structure comprising:

a substrate level;

at least two interlevel dielectric levels on the substrate level, including a lower level and an upper level, the lower level including a plurality of electrical contact features, the at least two interlevel dielectric levels including an interlevel metal line and an upper level metal line above the interlevel metal line;

a skip level via extending from the upper level metal line in the upper level through at least one of the interlevel dielectric levels without contacting the interlevel metal line, wherein the skip level via extends into electrical contact with a first element of the plurality of electrical contact features in the lower level, wherein the skip level via includes a skip level via opening and a spacer comprising a dielectric material, the spacer being present on a lower portion of sidewalls of the skip level via opening, and wherein the spacer is recessed such that an upper portion of the sidewalls of the skip level via opening is free of the spacer; and a single level via extending from the interlevel metal line into electrical contact with at least a second element of the plurality of electrical contact features, wherein the dielectric material of the spacer is not present on sidewalls of the single level via.

8. The electrical communication structure of claim 7, wherein the dielectric material of the spacer is selected from the group consisting of silicon oxide, silicon nitride, silicon oxynitride, aluminum oxide, and combinations thereof.

9. The electrical communication structure of claim 7, wherein the dielectric material of the spacer is a low-k dielectric.

10. The electrical communication structure of claim 7, wherein the spacer has a thickness ranging from 2 nm to 5 nm.

11. The electrical communication structure of claim 7, wherein the spacer is positioned between an electrically conductive fill of the skip level via and the interlevel metal line to obstruct the skip level via from shorting to the interlevel metal line.

12. The electrical communication structure of claim 7, wherein the skip level via further comprises a via liner, the via liner being a conformal structure present on the sidewalls and a base of the skip level via opening, wherein on the lower portion of the sidewalls of the skip level via opening, the via liner is between an electrically conductive fill of the skip level via and the spacer.

13. A method of forming an electrical communication structure, comprising:

providing an initial structure comprising a substrate level and at least two interlevel dielectric levels on the substrate level, including a lower level and an upper level, the lower level including a plurality of electrical contact features, the at least two interlevel dielectric levels including an interlevel metal line, and the initial structure further including a single level via extending from the interlevel metal line into electrical contact with at least a second element of the plurality of electrical contact features;

forming a skip level via opening through at least one of the interlevel dielectric levels to a first element of the plurality of electrical contact features in the lower level, the skip level via opening bypassing the interlevel metal line;

forming a spacer comprising a dielectric material on sidewalls of the skip level via opening;

recessing the spacer such that the spacer remains present on a lower portion of the sidewalls of the skip level via opening, and an upper portion of the sidewalls of the skip level via opening is free of the spacer;

forming a skip level via by depositing electrically conductive material in the skip level via opening; and forming an upper level metal line in the upper level above the interlevel metal line and in electrical communication with the skip level via, wherein the skip level via extends from the upper level metal line through at least one of the interlevel dielectric levels without contacting the interlevel metal line, and wherein the dielectric material of the spacer is not present on sidewalls of the single level via.

14. The method of claim 13, wherein the dielectric material of the spacer is selected from the group consisting of silicon oxide, silicon nitride, silicon oxynitride, aluminum oxide, and combinations thereof.

15. The method of claim 13, wherein the dielectric material of the spacer is a low-k dielectric.

16. The method of claim 13, wherein the spacer has a thickness ranging from 2 nm to 5 nm.

17. The method of claim 15, wherein the electrically conductive material forms an electrically conductive fill of the skip level via, the spacer being positioned between the electrically conductive fill and the interlevel metal line to obstruct the skip level via from shorting to the interlevel metal line.

18. The method of claim 12, further comprising, after recessing the spacer and before forming the skip level via and the upper level metal line, forming a trench in the upper level, the trench communicating with the skip level via opening.

19. The method of claim 18, wherein forming the skip level via and forming the upper level metal line comprise filling the trench and the skip level via opening together using a dual damascene process.

20. The method of claim 13, wherein recessing the spacer comprises a directional etch process.

* * * * *